United States Patent [19]
Ratti et al.

[11] 4,109,379
[45] Aug. 29, 1978

[54] MANIPULATOR FOR THE INSERTION AND EXTRACTION OF PRINTED-CIRCUIT BOARDS INTO AND FROM A HOLDER THEREFOR

[75] Inventors: Franco Ratti, Milan; Gianantonio Vivarelli, Cesano Boscone; Dario Maganza, Cornaredo; Emanuele D'Amore, Milan, all of Italy

[73] Assignee: Societa Italiana Telecommunicazioni Siemens S.p.A., Milan, Italy

[21] Appl. No.: 813,229

[22] Filed: Jul. 6, 1977

[30] Foreign Application Priority Data

Jul. 7, 1976 [IT] Italy .............................. 25079 A/76

[51] Int. Cl.² ....................... H05K 3/30; B25B 27/14
[52] U.S. Cl. ..................................... 29/747; 29/758; 29/759; 29/764; 29/278; 294/15
[58] Field of Search ............... 29/747, 758, 759, 764, 29/278, 628; 294/15

[56] References Cited
U.S. PATENT DOCUMENTS

| | | | |
|---|---|---|---|
| 3,110,960 | 11/1963 | Rondash | 29/278 |
| 3,617,083 | 11/1971 | Koppensteiner et al. | 29/278 X |
| 3,903,576 | 9/1975 | Stein | 29/764 |

*Primary Examiner*—Carl E. Hall
*Attorney, Agent, or Firm*—Karl F. Ross

[57] ABSTRACT

To facilitate the insertion of printed-circuit boards into a holder whose sidewalls form guide tracks for these boards and whose bottom has contacts engageable by terminal tabs on the boards, as well as the extraction of such boards from the holder, a C-frame adapted to span the holder surrounds a slider having a pair of lugs which point to the interior of the holder when the frame legs come to rest on its sidewalls and which carry hooks fitting into holes of a printed-circuit board lying in the plane of the frame. The slider is biased by leaf springs into an extended position, defined by stops on the frame legs, in which it can be locked by a latch during an insertion operation. For extracting an inserted printed-circuit board from the holder, the slider is unlocked and is then squeezed against the ridge of the frame resting against the holder walls to disengage the terminal tabs from their contacts before fully withdrawing the board.

10 Claims, 6 Drawing Figures

MANIPULATOR FOR THE INSERTION AND EXTRACTION OF PRINTED-CIRCUIT BOARDS INTO AND FROM A HOLDER THEREFOR

FIELD OF THE INVENTION

Our present invention relates to a device, referred to hereinafter as a manipulator, designed to facilitate the insertion of printed-circuit boards into a holder therefor as well as their subsequent extraction from that holder.

BACKGROUND OF THE INVENTION

Nowadays, printed-circuit boards are frequently assembled in a holder or rack having the shape of an open-topped box whose sidewalls form tracks for the guidance of the boards into and out of their assembled position in which terminal tabs on a base strip or block of each board fit into a socket having coacting contacts to complete a connection to an external circuit. (In practice, the track-forming sidewalls may be horizontally disposed, with the contact-bearing sockets arranged on the upright rear wall.)

The emplacement of such printed-circuit boards in their holder is a somewhat delicate operation since in the last phase thereof an additional thrust must be exerted in order to interfit the coacting connector pairs of which there could be several tens per board. In view of the great frictional resistance, attempts to insert a board with the bare hands may cause injury to the operator whose fingers could be cut by the exposed front edges of the board when applying pressure thereto. It is also important to hold the board properly aligned with its guide channels in order to avoid bending stresses which could damage the printed circuits. Extracting the inserted board again poses problems since the abrupt reduction of the frictional resistance upon disengagement of the connectors may lead to an accelerated withdrawal motion deviating from straight linearity. These difficulties are only partly obviated by conventional manipulators of which we are aware.

OBJECT OF THE INVENTION

The object of our present invention, therefore, is to provide an improved manipulator of the character described which facilitates both the insertion and the extraction of such printed-circuit boards.

SUMMARY OF THE INVENTION

A manipulator according to our invention comprises a generally C-shaped frame having a ridge positionable at right angles to the sidewalls of the holder on whose exposed edges the legs of the frame are able to come to rest. A slider, received in the frame between these legs, has one or more lugs pointing to the interior of the holder in the position referred to, each lug carrying a preferably hook-shaped gripping formation engageable with a mating formation such as a hole on the associated printed-circuit board. The slider, which is advantageously designed as a flat bar parallel to the ridge of the frame, is urged by biasing means such as one or more leaf springs into an extended position remote from the ridge in which it is arrested by stop means such as a pair of pins projecting into lateral guide channels formed by the frame legs. For the insertion of a board into the holder, the slider is locked in its extended position by a latch so as to serve as a rigid pusher through which the necessary force can be applied to the board; when a board is to be extracted, the slider is unlocked by the latch and can be withdrawn from its extended position by being squeezed against the ridge of the frame which rests with its legs on the exposed sidewall edges, the withdrawal stroke of the slider being sufficient to disengage the board terminals from their coacting connectors whereupon the extraction step can be easily completed with minimum force.

BRIEF DESCRIPTION OF THE DRAWING

The above and other features of our invention will now be described in detail with reference to the accompanying drawing in which.

SPECIFIC DESCRIPTION

Figure 1:
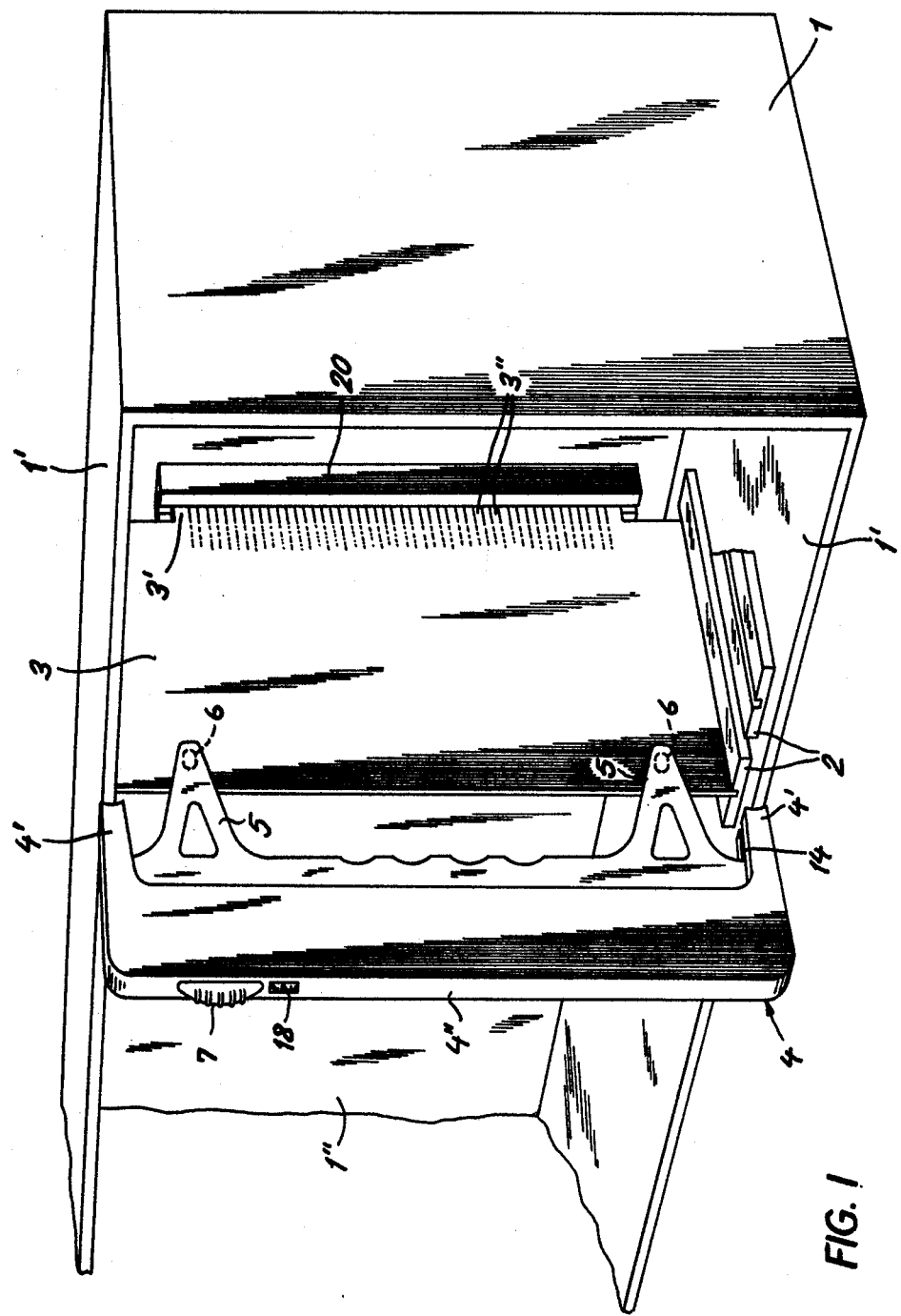
FIG. 1 is a perspective view of a holder for printed-circuit boards, showing one such board gripped by a manipulator according to our invention.
Figure 2:
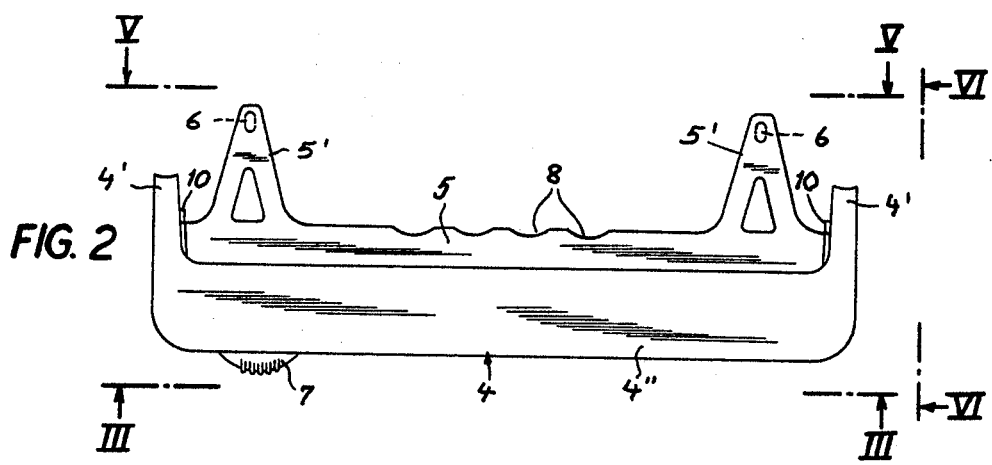
FIG. 2 is an elevational view of the manipulator shown in FIG. 1.
Figure 3:
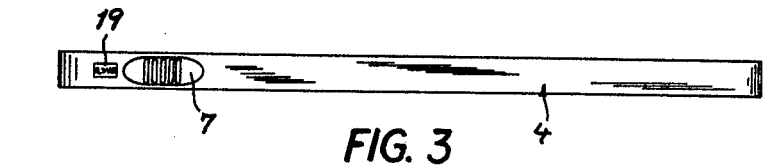
FIG. 3 is an edge view of the manipulator taken along the line III — III of FIG. 2.
Figure 4:
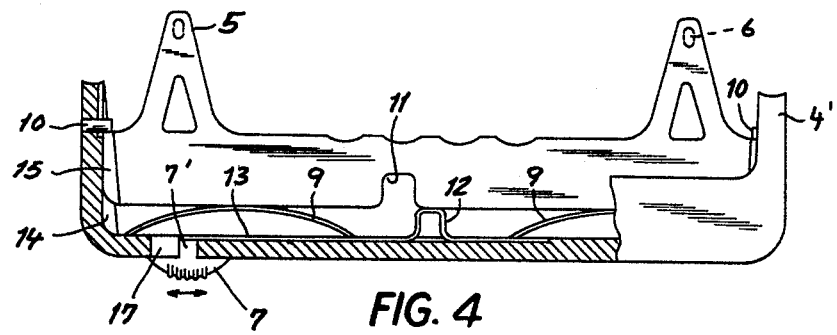
FIG. 4 is a view similar to FIG. 2 but with parts broken away to show the internal construction of the manipulator.

In FIG. 1 we have illustrated a representative portion of a holder 1 for a multiplicity of printed-circuit boards of which one has been shown at 3. Holder 1 has a pair of parallel sidewalls 1' and a bottom or rear wall 1", each sidewall being provided on its inner surface with a set of guide tracks 2 for a lateral edge of a respective board 3. An extension 3' of each board carries a number of terminal tabs 3" receivable in a contact-carrying socket 20 on the holder bottom 1".

Figure 6:
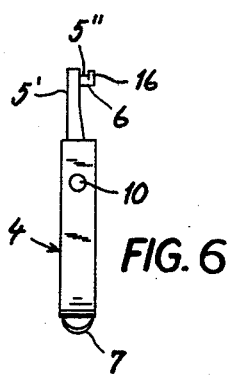
FIG. 6 is an end view taken along the line VI — VI of FIG. 2.

A manipulator according to our invention, designed to facilitate the insertion and extraction of any printed-circuit board 3, comprises a C-frame or yoke 4 which spans the sidewalls 1' of the holder 1 and has a pair of legs 4' shown to rest on exposed edges of these sidewalls, the legs 4' being interconnected by a transverse member or ridge 4" integral therewith. The frame 4 is hollow and partly receives a slider 5, in the shape of a flat bar, formed close to its ends with two coplanar lugs 5' pointing to the interior of the holder in the position illustrated. Each lug 5' carries a projection 6 with a hook-shaped extremity 16, as best seen in FIG. 6, which fits into a corresponding hole of the printed-circuit board 3 to be inserted or extracted. In the illustrated embodiment these holes are assumed to be located on the body of board 3, yet they could also be provided on forwardly extending tongues thereof.

Reference will now be made to FIGS. 2–6 for a more detailed description of our improved manipulator. Between its lugs 5', slider 5 has a scalloped profile forming finger grips 8 which facilitate its withdrawal from an extended position (i.e. an elevated position as viewed in FIGS. 2, 4 and 6) into which it is urged by a pair of leaf springs 9 and in which it is arrested by stops 10 having the form of short pins extending into guide channels 14 formed by the frame legs 4'. It will be noted that insertion of these pins 10 is the only operation required to hold the components of the manipulator together. The ends 15 of slider 5 are reduced in thickness to fit into the guide channels 14.

A latch assembly comprises a knob 7 which is longitudinally shiftable on the outer surface of ridge 4" and is provided for this purpose with a stem 7' traversing a slot 17 in the frame wall, the stem being rigid with a strip 13 guided in a shallow groove on the inner surface of that wall. Strip 13 is bent to form a boss 12 which is receivable in an indentation 11 of slider 5 upon being aligned therewith by a leftward shift of knob 7 from the locking position illustrated in FIG. 4; in that locking position, slider 5 remains extended to facilitate insertion of a printed-circuit board in its holder as described above. The locking or unlocking position is indicated by the alternate exposure of two markings 18 (FIG. 1) and 19 (FIG. 3) as the knob 7 is shifted in one or the other direction.

Figure 5:
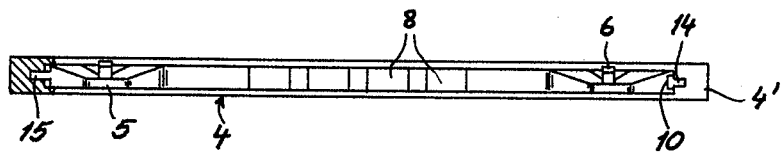
FIG. 5 is an edge view taken along the line V — V of FIG. 2.

As seen in FIGS. 5 and 6, each lug 5' has a chamfered face 5" substantially in line with the lower boundaries of guide channels 14 (as viewed in FIG. 5) so as to let the engaged board lie in a plane defined by these guide channels. Upon visual alignment of channels 14 with the slots of guide tracks 2 (FIG. 1), this positioning avoids the exertion of bending stresses upon the engaged board when the slider 5 is withdrawn by finger pressure from its extended position to disengage the terminal tabs 3" from socket 20. The hook shape of the grippers 6, 16 avoids the risk of premature detachment of the slider from the board, thereby protecting the fingers of the operator from being injured by the exposed board edge during insertion.

We claim:

1. A manipulator for facilitating insertion of a printed circuit board into a holder and subsequent extraction of said board from the holder, the latter having a pair of parallel sidewalls forming guide tracks for respective lateral board edges and further having stationary connectors engageable by coacting connectors on a transverse edge of the inserted board, comprising:

a generally C-shaped frame having a ridge positionable at right angles to said sidewalls in line with a printed-circuit board to be inserted or extracted, said frame further having a pair of legs transverse to said ridge adapted to come to rest on exposed edges of said sidewalls;

a slider received in said frame between said legs, said slider being provided with lug means pointing to the interior of said container upon a positioning of said legs on said exposed edges, said lug means carrying a gripping formation engageable with a mating formation on the associated printed-circuit board;

stop means on said frame defining an extended position remote from said ridge for said slider;

biasing means on said frame urging said slider into said extended position; and latch means on said frame for selectively locking said slider in said extended position to facilitate the insertion of the associated printed-curcuit board, said slider being withdrawable from said extended position upon deactivation of said latch means for disengaging the connectors of said board from respective connectors of said holder preparatorily to complete extraction of the board from the holder.

2. A manipulator as defined in claim 1 wherein said slider is a flat bar parallel to said ridge.

3. A manipulator as defined in claim 2 wherein said frame is provided with lateral guide channels for said bar, said lug means having a face accommodating said gripping formation in a plane defined by said guide channels.

4. A manipulator as defined in claim 3 wherein said stop means comprises a pair of pins projecting into said guide channels.

5. A manipulator as defined in claim 2 wherein said biasing means comprises at least one leaf spring inserted between said ridge spine and said bar.

6. A manipulator as defined in claim 2 wherein said bar has an indentation facing said ridge, said latch means comprising a strip displaceable along said ridge and provided with a boss aligned with said indentation in an unlocking position and disaligned therefrom in a locking position.

7. A manipulator as defined in claim 6 wherein said latch means further comprises a knob linked to said strip and positioned externally on said ridge.

8. A manipulator as definedin claim 2 wherein said lug means comprises a pair of lugs adjacent opposite ends of said bar.

9. A manipulator as defined in claim 8 wherein said bar is provided with finger grips between said lugs.

10. A manipulator as defined in claim 1 wherein said gripping formation is a hook.

* * * * *